(12) United States Patent
Oh et al.

(10) Patent No.: US 9,735,322 B2
(45) Date of Patent: Aug. 15, 2017

(54) LIGHT-EMITTING DIODE PACKAGE

(71) Applicant: Seoul Semiconductor Co., Ltd., Ansan-si (KR)

(72) Inventors: Kwang Yong Oh, Ansan-si (KR); Ho Jun Byun, Ansan-si (KR); Ki Bum Nam, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/122,050

(22) PCT Filed: Feb. 23, 2015

(86) PCT No.: PCT/KR2015/001715
§ 371 (c)(1),
(2) Date: Aug. 26, 2016

(87) PCT Pub. No.: WO2015/130055
PCT Pub. Date: Sep. 3, 2015

(65) Prior Publication Data
US 2017/0018692 A1    Jan. 19, 2017

(30) Foreign Application Priority Data

Feb. 28, 2014  (KR) .................. 10-2014-0024613
Apr. 18, 2014  (KR) .................. 10-2014-0046707

(51) Int. Cl.
*H01L 33/00* (2010.01)
*H01L 33/50* (2010.01)
*H01L 33/56* (2010.01)

(52) U.S. Cl.
CPC ............ *H01L 33/504* (2013.01); *H01L 33/56* (2013.01); *H01L 33/502* (2013.01)

(58) Field of Classification Search
CPC ..... H01L 33/504; H01L 33/483; H01L 33/54; H01L 33/60
(Continued)

(56) References Cited

U.S. PATENT DOCUMENTS

2005/0109238 A1* 5/2005 Yamaki ............... B32B 7/02
106/287.16
2010/0142189 A1* 6/2010 Hong .................. C09K 11/616
362/97.3
(Continued)

FOREIGN PATENT DOCUMENTS

JP    2001-184910    7/2001
JP    2007-262375    10/2007
(Continued)

OTHER PUBLICATIONS

International Search Report for International Application No. PCT/KR2015/001715.

*Primary Examiner* — Tu-Tu Ho
(74) *Attorney, Agent, or Firm* — H.C. Park & Associates, PLC (57) ABSTRACT

The present invention relates to a light-emitting diode package comprising a high-strength molding part. The light-emitting diode package, according to the present invention, comprises: a housing; at least one light-emitting diode chip disposed in the housing; a molding part which covers the at least one light-emitting diode chip; a first phosphor excited by the at least one light-emitting diode chip so as to emit green light; and a second phosphor excited by the at least one light-emitting diode chip so as to emit red light, wherein the molding part has an oxygen gas permeability of 140 cc/m²/day or less, and the second phosphor can emit red light having a full width at half maximum of 20 nm or less.

17 Claims, 3 Drawing Sheets

(58) Field of Classification Search
USPC .......................................................... 257/89
See application file for complete search history.

(56) References Cited

U.S. PATENT DOCUMENTS

| | | | | |
|---|---|---|---|---|
| 2010/0283382 | A1* | 11/2010 | Kwak | ................... C09K 11/025 |
| | | | | 313/503 |
| 2014/0138723 | A1* | 5/2014 | Liao | ....................... C09K 11/02 |
| | | | | 257/98 |
| 2014/0232257 | A1* | 8/2014 | Watanabe | ............. H01L 33/504 |
| | | | | 313/503 |
| 2015/0129916 | A1* | 5/2015 | Bera | ..................... H01L 33/504 |
| | | | | 257/98 |

FOREIGN PATENT DOCUMENTS

| | | |
|---|---|---|
| JP | 2008-111112 | 5/2008 |
| JP | 2011-029497 | 2/2011 |
| KR | 10-2013-0017031 | 2/2013 |

* cited by examiner

LIGHT-EMITTING DIODE PACKAGE

CROSS-REFERENCE TO RELATED APPLICATIONS

This application is the National Stage entry of International Application PCT/KR2015/001715, filed on Feb. 23, 2015, and claims priority from Korean Patent Application No. 10-2014-0024613, filed on Feb. 28, 2014, and Korean Patent Application No. 10-2014-0046707, filed on Apr. 18, 2014, each of which is incorporated herein by reference for all purposes as if fully set forth herein.

BACKGROUND

Field

Exemplary embodiments of the present disclosure relate to a light emitting diode package. More particularly, exemplary embodiments of the present disclosure relate to a light emitting diode package including a molding portion having high strength.

Discussion of the Background

A light emitting diode (LED) package refers to a compound semiconductor device having a p-n junction structure and emitting light through recombination of carriers (electrons or holes). The light emitting diode package has low power consumption and long lifespan and can be fabricated in a small size.

A light emitting diode package can realize white light through wavelength conversion means including phosphors. Specifically, the phosphors are disposed above a light emitting diode chip such that the light emitting diode package can realize white light through mixture of some of primary light emitted from the light emitting diode chip and secondary light subjected to wavelength conversion by the phosphors. With this structure, the white light emitting diode package is broadly used due to advantages of inexpensiveness and a simple structure.

Specifically, the light emitting diode package can realize white light by depositing phosphors, which emit yellowish green or yellow light through absorption of some of blue light as excitation light, on a blue light emitting diode chip. Korean Patent Laid-open Publication No. 10-2004-0032456 discloses a light emitting diode, in which phosphors are deposited on a blue light emitting diode chip to emit yellowish green or yellow light using some light emitted from the blue light emitting diode as excitation light such that the light emitting diode can emit white light through mixture of the blue light and the yellowish green or yellow light.

However, since such a white light emitting diode package uses light emission of yellow phosphors, the white light emitting diode has low color rendition due to spectrum depletion in green and red regions of light emitted therefrom. Particularly, in use of the white light emitting diodes as a light source of a backlight unit, it is difficult to realize a color approaching a natural color due to low color purity after light passes through a color filter.

In order to solve such problems, a light emitting diode is fabricated using a blue light emitting diode chip and phosphors emitting green and red light using blue light as excitation light. That is, it is possible to realize white light having high color rendition through mixture of blue light and green light and red light, which are excited by the blue light. In a structure wherein such a white light emitting diode is used in a backlight unit, it is possible to realize an image approaching a natural color due to high conformity with the color filter. However, light emitted from the phosphors through excitation by the phosphors has a wider full width at half maximum than light emitted from the light emitting diode chip. Korean Patent Registration No. 10-0961324 discloses nitride phosphors, a method of preparing the same, and a light emitting device. In luminous spectra of a light emitting device including nitride phosphors, it can be seen that light emitted from the light emitting device has a wider full width at half maximum in the red band.

Accordingly, it is necessary to use phosphors having a narrower full width at half maximum in order to realize white light having higher color rendition. However, the phosphors having a narrower full width at half maximum are generally vulnerable to moisture, thereby causing deterioration in overall reliability of the light emitting diode package.

SUMMARY

It is one aspect of the present disclosure to provide a light emitting diode package having improved reliability.

It is another aspect of the present disclosure to provide a light emitting diode package having improved moisture resistance.

It is a further aspect of the present disclosure to provide a light emitting diode package configured to block contact between phosphors and moisture.

It is yet another aspect of the present disclosure to provide a light emitting diode package capable of maintaining light retention for a long period of time.

It is yet another aspect of the present disclosure to provide a light emitting diode package including phosphors having improved luminous intensity.

It is yet another aspect of the present disclosure to provide a light emitting diode package having improved color reproducibility.

It is yet another aspect of the present disclosure to provide a light emitting diode package including phosphors emitting green light and/or red light having a narrow full width at half maximum.

It is yet another aspect of the present disclosure to provide a light emitting diode package including phosphors having coating layers in order to improve moisture resistance.

It is yet another aspect of the present disclosure to provide a light emitting diode package including phosphors coated to exhibit hydrophobic properties.

In accordance with one exemplary embodiment of the present disclosure, a light emitting diode package includes: a housing; at least one light emitting diode chip disposed inside the housing; a molding portion covering the at least one light emitting diode chip; a first phosphor excited by the at least one light emitting diode chip to emit green light; and a second phosphor excited by the at least one light emitting diode chip to emit red light, wherein the molding portion has an oxygen gas permeability of 140 $cc/m^2/day$ or less and the second phosphor emits red light having a full width at half maximum of 20 nm or less.

The molding portion may have an oxygen gas permeability of 100 to 140 $cc/m^2/day$.

The second phosphor may be represented by Formula $A_2MF_6:Mn^{4+}$ where A is one of Li, Na, K, Rb, Ce and $NH_4$, and M is one of Si, Nb and Ta.

The first phosphor may be at least one of BAM-based phosphors and quantum dot phosphors.

The first phosphor may emit green light having a peak wavelength in the range of 520 nm to 570 nm and the second phosphor may emit red light having a peak wavelength in the range of 610 nm to 650 nm.

The molding portion may include at least one of silicone, epoxy, PMMA, PE, and PS resins.

The light emitting diode package may further include a buffer portion disposed between the molding portion and the at least one light emitting diode chip, wherein the buffer portion has a higher oxygen permeability than the molding portion.

The second phosphor may have a particle diameter of 25 μm to 40 μm.

The at least one light emitting diode chip may include at least one of a blue light emitting diode chip and a UV light emitting diode chip.

The housing may include a reflector reflecting light emitted from the at least one light emitting diode chip.

The housing may further include a barrier reflector covering the reflector.

The molding portion may include a first molding portion covering the at least one light emitting diode chip; and a second molding portion covering the first molding portion, the first molding portion may contain the second phosphor, and the second molding portion may contain the first phosphor.

The light emitting diode package may further include a phosphor plate disposed on the molding portion and containing the first and second phosphors.

The light emitting diode package may emit white light having an NTSC (National Television System Committee) color saturation of 90% or more through mixture of light emitted from the light emitting diode chip and light emitted from the first phosphor and the second phosphor.

The light emitting diode package may further include a coating layer formed on a surface of at least one of the first phosphor and the second phosphor. With this structure, the light emitting diode package can prevent the first and second phosphors from contacting moisture.

The coating layer may include a silane coating material. Since the silane coating material exhibits hydrophobic properties, surfaces of the first and second phosphors can be prevented from coupling with moisture.

The silane coating material may be a silane halide or methylated silane.

The silane halide may be fluorine silane.

In accordance with another exemplary embodiment of the present disclosure, a light emitting diode package includes: a housing; a light emitting diode chip disposed inside the housing; and at least one phosphor excited by the light emitting diode chip, wherein the phosphor has a particle diameter of 25 μm or more and emits red light having a full width at half maximum of 20 nm or less.

The phosphor may be represented by Formula $A_2MF_6$:$Mn^{4+}$ where A is one of Li, Na, K, Rb, Ce and $NH_4$, and M is one of Si, Nb and Ta The phosphor may have a particle diameter of 25 μm to 40 μm.

In accordance with a further exemplary embodiment of the present disclosure, a light emitting diode package includes: a housing; a light emitting diode chip disposed inside the housing; at least one phosphor excited by the light emitting diode chip; and a coating layer enclosing the phosphor, wherein the coating layer may include a silane coating material.

The silane coating material may include methylated silane or a silane halide.

The coating layer may be formed by coating the silane halide on surfaces of the first phosphor and the second phosphor.

According to exemplary embodiments, the light emitting diode package can block phosphors dispersed in a molding portion from contacting external moisture, thereby improving reliability of the phosphors. In addition, the light emitting diode package can maintain light retention for a long period of time.

In the light emitting diode package according to the exemplary embodiments, the phosphors can discharge green light and/or red light having a narrow full width at half maximum, thereby improving color reproducibility of the light emitting diode package. In addition, the light emitting diode package can have improved luminous intensity through adjustment of a particle diameter of the phosphors.

In the light emitting diode package according to the exemplary embodiments, the phosphors may be coated with a coating layer including a silane halide to prevent the phosphors from contacting moisture, thereby improving reliability.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Hereinafter, exemplary embodiments of the present disclosure will be described in detail with reference to the accompanying drawings. Throughout the specification, like reference numerals denote like elements having the same or similar functions. Detailed description of components or functions apparent to those skilled in the art will be omitted for clarity. It should be understood that the following exemplary embodiments are provided by way of example and that the present disclosure is not limited to the embodiments disclosed herein and can be implemented in different forms by those skilled in the art.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
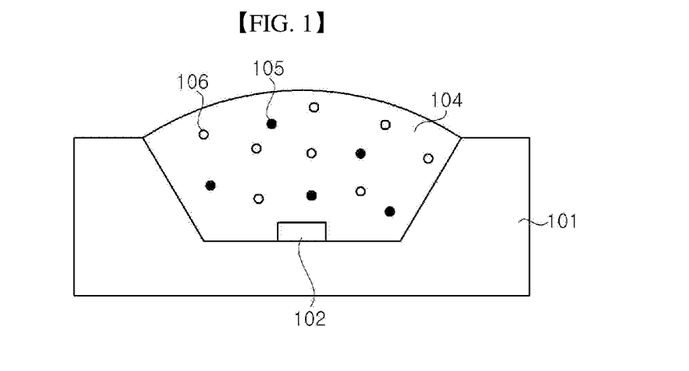
FIG. 1 is a sectional view of a light emitting diode package according to one exemplary embodiment of the present disclosure.

FIG. 1 is a sectional view of a light emitting diode package according to one exemplary embodiment of the present disclosure. Referring to FIG. 1, the light emitting diode package includes a housing 101, a light emitting diode chip 102, a first phosphor 105, a second phosphor 106, and a molding portion 104.

The light emitting diode chip 102, the first phosphor 105, the second phosphor 106 and the molding portion 104 may be disposed on the housing 101. The light emitting diode chip 102 may be disposed on a bottom surface of the housing 101. The housing 101 may be provided with lead terminals (not shown) through which power is supplied to the light emitting diode chip 102. The molding portion 104 may include first and second phosphors 105, 106 and may cover the light emitting diode chip 102.

The housing 101 may be formed of a typical plastic (polymer) material, acrylonitrile butadiene styrene (ABS), liquid crystalline polymer (LCP), polyimide (PA), polyphenylene sulfide (IPS), thermoplastic elastomer (TPE), metal or ceramics. If the light emitting diode chip 102 is a UV light emitting diode chip, the housing 101 may be formed of ceramics. In the structure wherein the housing 101 is formed of ceramics, since there is no concern of decoloration or degradation of the housing including the ceramics by UV light emitted from the UV light emitting diode chip, the light emitting diode package can maintain reliability. When the housing 101 is formed of a metal, the housing 101 may include two or more metal frames, which may be insulated from each other. With the structure wherein the housing 101 includes a metal, the light emitting diode package can have improved heat dissipation capabilities. Although some exemplary materials for the housing 101 are set forth above, it should be understood that the housing 101 may also be formed of various materials without being limited thereto.

The housing 101 may include an inclined inner wall in order to reflect light emitted from the light emitting diode chip 102.

The molding portion 104 may be formed of a material having high hardness. Specifically, the molding portion 104 may have a Shore hardness of 69 to 71 as measured using a D type indenter. As hardness unit of the molding portion 104, the molding portion 104 may have an oxygen gas permeability of 100 to 140 cc/m²/day. To impart high hardness to the molding portion 104, the molding portion 104 may be formed of at least one material selected from among silicone, epoxy, poly(methyl methacrylate) (PMMA), polyethylene (PE) and polystyrene (PS) resins.

The molding portion 104 may be formed by injection molding using a mixture of the aforementioned material and the first and second phosphors 105, 106. Alternatively, the molding portion 104 may be formed by preparing a preform using a separate mold, followed by compression or heat treatment. The molding portion 104 may be formed in various shapes such as a convex lens shape, a flat plate shape (not shown), and a shape having roughness on a surface thereof. Although the light emitting diode package according to this exemplary embodiment is illustrated as having a convex lens shape, it should be understood that the molding portion 104 is not limited thereto.

The light emitting diode chip 102 may be a UV light emitting diode chip or a blue light emitting diode chip. If the light emitting diode chip 102 is a blue light emitting diode chip, the light emitting diode chip 102 may emit light having a peak wavelength in the range of 410 nm to 490 nm. The light emitting diode chip 102 may emit blue light having a full width at half maximum (FWHM) of 40 nm or less. Although the light emitting diode package is illustrated as including one light emitting diode chip 102 in this exemplary embodiment, it should be understood that the number and arrangement of the light emitting diode chips 102 are not limited thereto.

The first phosphor 105 may be excited by the light emitting diode chip 102 to emit green light. The second phosphor 106 may be excited by the light emitting diode chip 102 to emit red light.

The first phosphor 105 may emit green light having a peak wavelength in the range of 520 nm to 570 nm. The first phosphor 105 may emit green light having a full width at half maximum of 35 nm or less. The first phosphor 105 may include at least one phosphor selected from among BAM (Ba—Al—Mg) phosphors, quantum dot phosphors, and fluoride phosphors. The fluoride phosphors may be represented by $A_2MF_6:Mn^{4+}$. Here, A may be one of Li, Na, K, Rb, Ce and $NH_4$, and M may be one of Si, Nb and Ta. It should be understood that the first phosphor 105 is not limited thereto.

A narrower full width at half maximum of green light results in green light with higher color purity. If light has a full width at half maximum of 35 nm or more, the light has low color purity, thereby making it difficult to realize 90% or more of the total color reproduction coverage based on NTSC (National Television System Committee) standard adopted as a color television broadcast protocol. Accordingly, for the light emitting diode package according to the exemplary embodiment, the first phosphor emits green light having a full width at half maximum of 35 nm or less in order to realize white light having an NTSC color saturation of 90% or more.

The second phosphor 106 may be excited by the light emitting diode chip 102 to emit red light. The second phosphor 106 may emit red light having a peak wavelength in the range of 610 nm to 650 nm. The second phosphor 106 may include at least one phosphor selected from quantum dot phosphors, sulfide phosphors, and fluoride phosphors. The fluoride phosphors may be represented by $A_2MF_6:Mn^{4+}$. Here, A may be one of Li, Na, K, Rb, Ce and $NH_4$, and M may be one of Si, Nb and Ta. The second phosphor 106 may emit red light having a narrow full width at half maximum. Specifically, if the second phosphor 106 is quantum dot phosphors, the second phosphor may emit red light having a full width at half maximum of 30 nm to 40 nm, if the second phosphor 106 is sulfide phosphors, the second phosphor may emit red light having a full width at half maximum of 65 nm or less, and if the second phosphor 106 is fluoride phosphors, the second phosphor may emit red light having a full width at half maximum of 20 nm or less. That is, if the second phosphor 106 is fluoride phosphors, the second phosphor may emit red light having the narrowest full width at half maximum.

Figure 2:
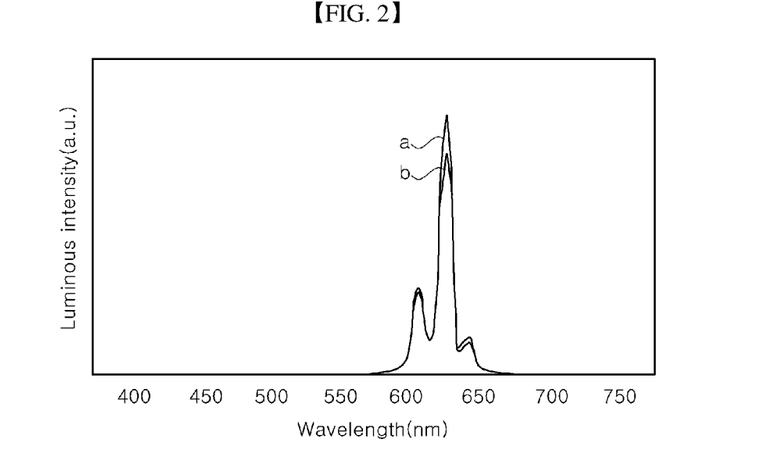
FIG. 2 is a graph depicting a relationship between luminous intensity and particle diameter of a second phosphor in the light emitting diode package according to the exemplary embodiment of the present disclosure.

FIG. 2 is a graph depicting a relationship between luminous intensity and particle diameter of the second phosphor in the light emitting diode package according to the exemplary embodiment of the present disclosure.

In FIG. 2, the second phosphor is fluoride phosphors, and Line a indicates luminous intensity when the second phosphor has a particle diameter of 30 μm, and Line b indicates luminous intensity when the second phosphor has a particle diameter of 20 μm.

As compared with the luminous intensity of the second phosphor having a particle diameter of 20 μm, the luminous intensity of the second phosphor having a particle diameter of 30 μm is improved by about 16%. In order to monitor variation in luminous flux of white light depending upon the particle diameter of the second phosphor, the second phosphor composed of fluoride phosphors having a particle diameter of 20 μm, 25 μm or 30 μm was combined with green phosphors.

With reference to a luminous flux of 100% provided by a combination of the second phosphor having a particle diameter of 20 μm and the green phosphors, it can be seen that a combination of the second phosphor having a particle diameter of 25 μm and the green phosphors improved luminous flux of white light to 102.30%. In addition, it can be seen that a combination of the second phosphor having a particle diameter of 30 μm and the green phosphors improved luminous flux of white light to 103.00%.

Thus, if the second phosphor according to this exemplary embodiment is fluoride phosphors, the second phosphor may have a particle diameter of 25 μm or more. Specifically, the second phosphor may have a particle diameter of 25 μm to 40 μm (in terms of D50). Within this range of particle diameters, the second phosphor can exhibit good luminous intensity and a light emitting device including the second phosphor can improve luminous flux of white light. As shown in the drawings, it is desirable that the first and second phosphors 105, 106 be uniformly distributed in the molding portion 104 such that more uniform white light can be realized through uniform mixture of red light emitted from the first phosphor 105, red light emitted from the second phosphor 106 and blue light emitted from the blue light emitting diode chip 102.

The first and second phosphors 105, 106 may be disposed around the light emitting diode chip 102 to be placed near the light emitting diode chip 102 or to be spaced apart therefrom. With the structure wherein the first and second phosphors 105, 106 are spaced apart from the light emitting diode chip 102, the light emitting diode package can prevent the first and second phosphors 105, 106 from being degraded by the light emitting diode chip 102.

Figure 3:
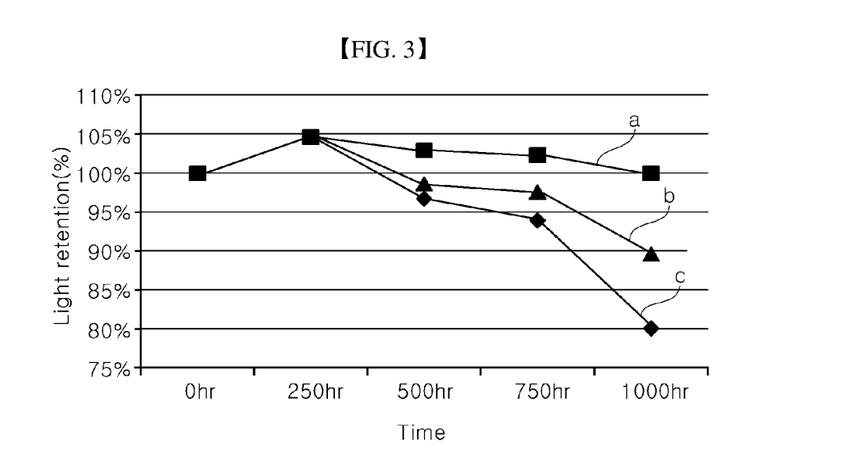
FIG. 3 is a graph depicting variation of light retention of a molding portion in the light emitting diode package according to the exemplary embodiment of the present disclosure over time.

FIG. 3 is a graph depicting variation of light retention of the molding portion in the light emitting diode package according to the exemplary embodiment of the present disclosure over time.

Referring to FIG. 3, Line a indicates a light retention of a molding portion having an oxygen gas permeability of 130 cc/m²/day, Line b indicates a light retention of a molding portion having an oxygen gas permeability of 260 cc/m²/day, and Line c indicates a light retention of a molding portion having an oxygen gas permeability of 520 cc/m²/day.

Since higher oxygen gas permeability means lower hardness of the molding portion, it can be seen that higher hardness of the molding portion results in higher light retention of a light emitting diode package over time. From Line a indicating a light retention of a molding portion having an oxygen gas permeability of 130 cc/m²/day, it can be seen that the molding portion exhibited a light retention of 100%, which is the same as an initial light retention, after 1,000 hours. Since the molding portion of the light emitting diode package according to the exemplary embodiment has an oxygen gas permeability of 100 to 140 cc/m²/day, it is possible to maintain the same luminous intensity for a long period of time.

Figure 4:
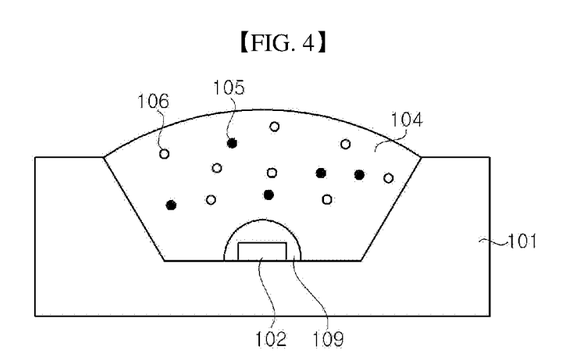
FIG. 4 is a sectional view of a light emitting diode package according to another exemplary embodiment of the present disclosure.

FIG. 4 is a sectional view of a light emitting diode package according to another exemplary embodiment of the present disclosure. Referring to FIG. 4, the light emitting diode package according to this exemplary embodiment includes a housing 101, a light emitting diode chip 102, a molding portion 104, a first phosphor 105, a second phosphor 106, and a buffer portion 109. The light emitting diode package according to this exemplary embodiment is generally similar to the light emitting diode package according to the above exemplary embodiment excluding the buffer portion 109, and thus a repeated description of the light emitting diode package according to this exemplary embodiment will be omitted.

The buffer portion 109 may be disposed between the light emitting diode chip 102 and the molding portion 104. The buffer portion may be formed of a material including at least one of silicone, epoxy, poly(methyl methacrylate) (PMMA), polyethylene (PE), and polystyrene (PS) resins. The buffer portion 109 may have a Shore hardness of 59 to 61, as measured using an A type indenter. That is, the buffer portion 109 may have a lower harness than the molding portion 104. Thus, the buffer portion 109 may have a higher oxygen gas permeability than the molding portion 104. With the buffer portion 109, the light emitting diode package can prevent the molding portion 104 from suffering thermal stress caused by heat generated from the light emitting diode chip 102. Although the buffer portion 109 is illustrated as being disposed around the light emitting diode chip 102 in this exemplary embodiment, the buffer portion 109 may be disposed in a wide area so as to contact both a left wall and a right wall of the housing 101.

Figure 5:
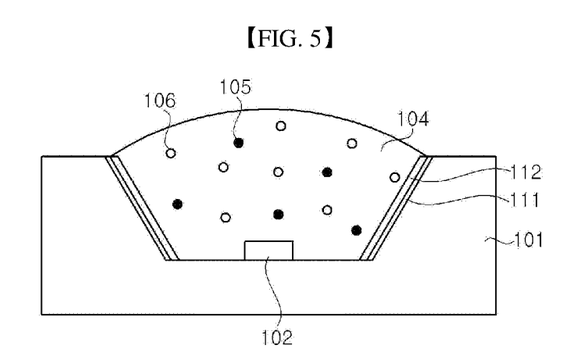
FIG. 5 is a sectional view of a light emitting diode package according to a further exemplary embodiment of the present disclosure.

FIG. 5 is a sectional view of a light emitting diode package according to a further exemplary embodiment of the present disclosure. Referring to FIG. 5, the light emitting diode package according to this exemplary embodiment includes a housing 101, a light emitting diode chip 102, a molding portion 104, a first phosphor 105, a second phosphor 106, a reflector 111, and a barrier reflector 112. The light emitting diode package according to this exemplary embodiment is generally similar to the light emitting diode package according to the above exemplary embodiment excluding the reflector 111 and the barrier reflector 112, and thus a repeated description of the light emitting diode package according to this exemplary embodiment will be omitted.

The reflector 111 may be disposed on the housing 101 to be placed on a side surface of the molding portion to be separated from the light emitting diode chip 102. The reflector 111 can maximize luminous efficacy through maximization of reflection of light emitted from the light emitting diode chip 102 and the first and second phosphors 105, 106. The reflector 111 may be formed of at least one of a reflective coating film and a reflective coating material layer. The reflector 111 may be formed of at least one selected from among inorganic materials, organic materials, metallic materials and metal oxide materials, which exhibit good thermal resistance and light resistance. By way of example, the reflector 111 may include a metal or a metal oxide, such as aluminum (Al), silver (Ag), gold (Au), and titanium dioxide ($TiO_2$), which exhibits high reflectivity. The reflector 111 may be formed on the housing 101 by depositing or coating a metal or a metal oxide, or by printing a metal ink. Alternatively, the reflector 111 may be formed on the housing 101 by bonding a reflective film or a reflective sheet thereto.

The barrier reflector 112 may cover the reflector 111. The barrier reflector 112 can prevent the reflector 111 from being degraded due to heat emitted from the light emitting diode chip 102. The barrier reflector 112 may be formed of an inorganic material or a metallic material which exhibits high light resistance and high reflectivity.

Figure 6:
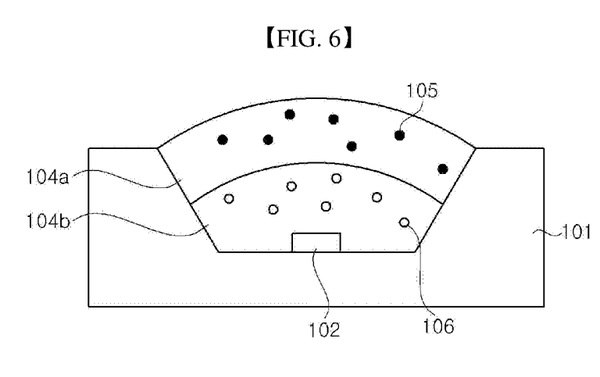
FIG. 6 is a sectional view of a light emitting diode package according to yet another exemplary embodiment of the present disclosure.

FIG. 6 is a sectional view of a light emitting diode package according to yet another exemplary embodiment of the present disclosure. Referring to FIG. 6, the light emitting diode package according to this exemplary embodiment includes a housing 101, a light emitting diode chip 102, a molding portion 104, a first phosphor 105, and a second phosphor 106, wherein the molding portion 104 may include a first molding portion 104b and a second molding portion 104a. The light emitting diode package according to this exemplary embodiment is generally similar to the light emitting diode package according to the above exemplary embodiment excluding the first molding portion 104b and the second molding portion 104a, and thus a repeated description of the light emitting diode package according to this exemplary embodiment will be omitted.

The first molding portion 104b may cover the light emitting diode chip 102. The second molding portion 104a may cover the first molding portion 104b. The first molding portion 104b may be formed of a material having the same hardness as the second molding portion 104a, or may be formed of a material having different hardness than the second molding portion 104a. The first molding portion 104b may have a lower hardness than the second molding portion 104a in order to relieve thermal stress caused by the light emitting diode chip 102, as in the buffer portion 109 described above.

The first molding portion 104b may contain a second phosphor 106 emitting red light. The second molding portion 104a may contain a first phosphor 105 emitting green light. In this way, phosphors emitting light having long wavelengths are disposed at a lower portion and phosphors emitting light having short wavelengths are disposed at an upper portion, thereby preventing green light emitted from the first phosphor 105 from being absorbed and lost by the second phosphor 106.

Figure 7:
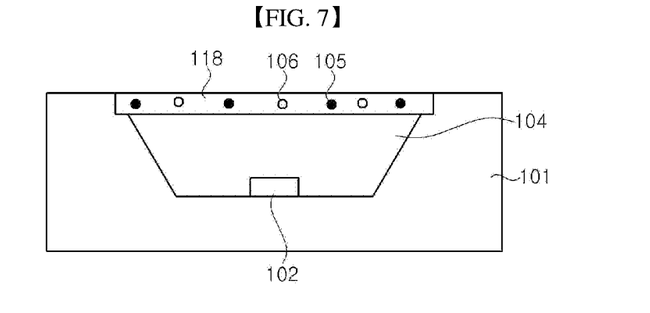
FIG. 7 is a sectional view of a light emitting diode package according to yet another exemplary embodiment of the present disclosure.

FIG. 7 is a sectional view of a light emitting diode package according to yet another exemplary embodiment of the present disclosure. Referring to FIG. 7, the light emitting diode package according to this exemplary embodiment includes a housing 101, a light emitting diode chip 102, a molding portion 104, a first phosphor 105, a second phosphor 106, and a phosphor plate 118. The light emitting diode package according to this exemplary embodiment is generally similar to the light emitting diode package according to the above exemplary embodiment excluding the phosphor plate 118, and thus a repeated description of the light emitting diode package according to this exemplary embodiment will be omitted.

The phosphor plate 118 is separated from the light emitting diode chip 102 to be disposed on the molding portion 104, and may include first and second phosphors 105, 106. The phosphor plate 118 may be formed of the same material as the molding portion 104 according to the above embodiment, or a material having high hardness.

Since the first and second phosphors 105, 106 are separated from the light emitting diode chip 102, it is possible to prevent damage due to heat or light emitted from the first and second phosphors 105, 106 and the phosphor plate 118. Accordingly, it is possible to improve reliability of the first and second phosphors 105, 106.

A hollow space may be formed between the phosphor plate 118 and the light emitting diode chip 102 instead of the molding portion 104.

Figure 8:
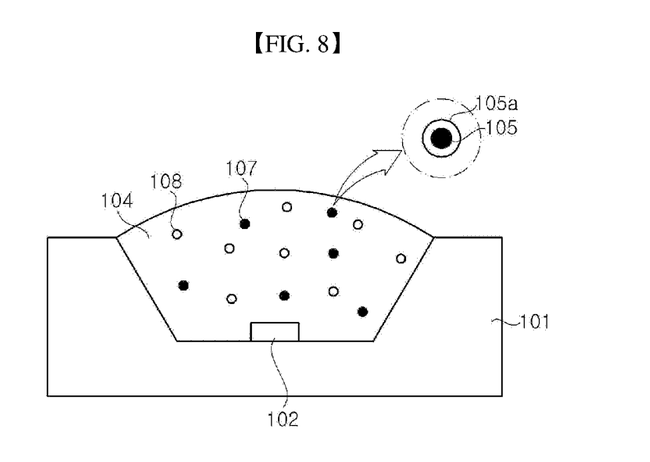
FIG. 8 is a sectional view of a light emitting diode package according to yet another exemplary embodiment of the present disclosure.

FIG. 8 is a sectional view of a light emitting diode package according to yet another exemplary embodiment of the present disclosure. Referring to FIG. 8, the light emitting diode package according to this exemplary embodiment includes a housing 101, a light emitting diode chip 102, a first coating phosphor 107, a second coating phosphor 108, and a molding portion 104. The first coating phosphor 107 includes a first phosphor 105 and a coating layer 105a. The light emitting diode package according to this exemplary embodiment is generally similar to the light emitting diode package according to the above exemplary embodiment excluding the first coating phosphor 107 and the second coating phosphor 108, and thus a repeated description of the light emitting diode package according to this exemplary embodiment will be omitted.

The first coating phosphor 107 may include the first phosphor 105 and the coating layer 105a surrounding the first phosphor 105. Although not shown in the drawing, the second coating phosphor 108 may also include a second phosphor 106 and a coating layer 105a surrounding the second phosphor 106.

The coating layer 105a may be formed on surfaces of the first and second phosphors 105, 106 to block the first and second phosphors 105, 106 from contacting moisture. The coating layer 105a may be coupled to the surfaces of the first and second phosphors 105, 106 to impart hydrophobic properties to the surfaces of the first and second coating phosphors 107, 108.

The coating layer 105a may include a silane coating material. The silane coating material may be methylated silane or a silane halide.

The methylated silane is a silicon containing compound in which a silane group is substituted with a methyl group. The silane halide may include at least one of fluorine (F), chlorine (Cl), bromine (Br), and iodine (I). The silane halide may be fluorine silane containing fluorine (F).

Herein, fluorine silane refers to a silicon-containing compound including a hydrocarbyl group substituted with at least one fluorine atom and a reactive hydrocarbyl oxy group capable of being displaced by a nucleophile. The hydrocarbyl oxy group is a linear, branched or cyclic group including hydrogen or carbon such as an alkane group, an alkene group, an alkyne group, and an aryl group. The hydrocarbyl group may include at least one selected from among a halogen group, a cyano group, a ketone group, an ester group, a hydroxyl group, a carboxyl group, oxygen, sulfur, and nitrogen, or may be partially substituted therewith. In addition, a fluoride hydrocarbyl group substituted with hydrogen may refer to perfluorohydrocarbyl(for example, perfluorooctyltriethoxysilane).

$$R_fSi(OR)_3 \qquad \text{[Formula 1]}$$

Formula 1 represents a fluorine silane compound according to one exemplary embodiment. Here, $R_f$ is a $C_4$ to $C_{16}$ hydrocarbyl group having at least one fluorine atom and R is a $C_1$ to $C_6$ hydrocarbyl group.

$$R_f'CH_2CH_2Si(OR)_3 \qquad \text{[Formula 2]}$$

Formula 2 represents a fluorine silane compound according to another exemplary embodiment. Here, $R_f'$ is $C_4$ to $C_{14}$ perfluorooctyltriethoxysilane and R is a methyl or ethyl group.

$$CF_3CF_2CF_2CF_2CF_2CF_2CH_2CH_2Si(OCH_2CH_3)_3 \qquad \text{[Formula 3]}$$

Formula 3 represents a fluorine silane compound according to a further exemplary embodiment. The fluorine silane compound represented by Formula 3 is tridecafluorooctyl-triethoxysilane.

The following description will be given of a process of forming the coating layer 105a covering the first and second phosphors 105, 106 using fluorine silane represented by Formula 3.

First, three ethanol molecules ($C_2H_5OH$) are produced from fluorine silane through reaction between the hydrocarbyl oxy group contained in the fluorine silane and water ($H_2O$). After three ethanol molecules are removed, the fluorine silane coupled to three hydrogen atoms from water ($H_2O$) is coupled to a hydroxyl group (—OH) on the surfaces of the phosphors while producing water ($H_2O$). As a result, the hydrophobic coating layer can be formed on the surfaces of the phosphors.

Although the above description is mainly given of formation of the coating layer on the surfaces of the phosphors using the fluorine silane, it should be understood that the present disclosure is not limited to the fluorine silane and any silane coating material may also be used.

According to this exemplary embodiment, since the surfaces of the first and second coating phosphors 107, 108 having the coating layer thereon exhibit hydrophobic properties, the coating layer can protect the first and second phosphors 105, 106 from moisture.

Although some exemplary embodiments have been described herein, it should be understood that these embodiments are given by way of illustration only and various modifications, variations and alterations can be made by those skilled in the art without departing from the spirit and scope of the present disclosure. Therefore, it should be understood that these embodiments and the accompanying drawings are given by way of illustration only and do not limit the scope of the present disclosure. The scope of the present disclosure should be interpreted according to the appended claims and equivalents thereof.

The invention claimed is:
1. A light emitting element comprising:
a housing;
at least one light emitting diode chip disposed inside the housing;
a molding portion covering the at least one light emitting diode chip;
a first phosphor configured to be excited by light emitted from the at least one light emitting diode chip, the first phosphor configured to emit green light; and
a second phosphor configured to be excited by light emitted from the at least one light emitting diode chip, the second phosphor configured to emit red light, wherein the molding portion comprises:
a first molding portion covering the at least one light emitting diode chip; and
a second molding portion covering the first molding portion, and wherein:
the second phosphor is disposed in the first molding portion,
the first phosphor is disposed in the second molding portion,
the molding portion has an oxygen gas permeability of 140 cc/m$^2$/day or less, and
the second phosphor is configured to emit red light having a full width at half maximum of 20 nm or less.

2. The light emitting diode package according to claim 1, wherein the molding portion has an oxygen gas permeability in the range of 100 to 140 cc/m$^2$/day.

3. The light emitting diode package according to claim 1, wherein the second phosphor is represented by Formula A$_2$MF$_6$:Mn$^{4+}$, where A is one of Li, Na, K, Rb, Ce and NH$_4$, and M is one of Si, Nb and Ta.

4. The light emitting diode package according to claim 1, wherein the first phosphor is at least one of a Ba-Al-Mg (BAM)-based phosphor and a quantum dot phosphor.

5. The light emitting diode package according to claim 1, wherein the first phosphor is configured to emit green light having a peak wavelength in the range of 520 nm to 570 nm and the second phosphor is configured to emit red light having a peak wavelength in the range of 610 nm to 650 nm.

6. The light emitting diode package according to claim 1, wherein the molding portion comprises at least one of silicone, epoxy, poly(methyl methacrylate) (PMMA), polyethylene (PE), and polystyrene (PS) resins.

7. The light emitting diode package according to claim 1, further comprising a buffer portion disposed between the molding portion and the at least one light emitting diode chip, wherein the buffer portion has a higher oxygen permeability than the molding portion.

8. The light emitting diode package according to claim 1, wherein the second phosphor has a particle diameter in the range of 25 μm to 40 μm.

9. The light emitting diode package according to claim 1, wherein the at least one light emitting diode chip comprises at least one of a blue light emitting diode chip and a UV light emitting diode chip.

10. The light emitting diode package according to claim 1, wherein the housing comprises a reflector configured to reflect light emitted from the at least one light emitting diode chip.

11. The light emitting diode package according to claim 10, wherein the housing further comprises a barrier reflector covering the reflector.

12. The light emitting diode package according to claim 1, further comprising a phosphor plate disposed on the molding portion, the first and second phosphors disposed in the phosphor plate.

13. The light emitting diode package according to claim 1, wherein the light emitting diode package is configured to emit white light having a National Television System Committee (NTSC) color saturation of 90% or greater through mixture of light emitted from the light emitting diode chip and light emitted from the first phosphor and the second phosphor.

14. The light emitting diode package according to claim 1, further comprising a coating layer disposed on a surface of at least one of the first phosphor and the second phosphor.

15. The light emitting diode package according to claim 14, wherein the coating layer comprises a silane coating material.

16. The light emitting diode package according to claim 15, wherein the silane coating material is a silane halide or methylated silane.

17. The light emitting diode package according to claim 16, wherein the silane halide is fluorine silane.

* * * * *